(12) United States Patent
Okita

(10) Patent No.: US 7,303,629 B2
(45) Date of Patent: Dec. 4, 2007

(54) APPARATUS FOR PULLING SINGLE CRYSTAL

(75) Inventor: Kenji Okita, Tokyo (JP)

(73) Assignee: Sumco Corporation, Tokyo (JP)

( * ) Notice: Subject to any disclaimer, the term of this patent is extended or adjusted under 35 U.S.C. 154(b) by 184 days.

(21) Appl. No.: 11/136,723

(22) Filed: May 25, 2005

(65) Prior Publication Data
US 2006/0021567 A1   Feb. 2, 2006

(30) Foreign Application Priority Data
May 28, 2004   (JP) .......................... P2004-158983

(51) Int. Cl.
*C30B 25/12*   (2006.01)
(52) U.S. Cl. .............................. 117/89; 117/84; 117/86
(58) Field of Classification Search .................. 117/84, 117/86, 89
See application file for complete search history.

(56) References Cited

FOREIGN PATENT DOCUMENTS

| JP | 64-076992 | * | 3/1989 |
| JP | 2000-007496 | | 1/2000 |
| JP | 2001-261480 | * | 9/2001 |

* cited by examiner

*Primary Examiner*—Felisa Hiteshew
(74) *Attorney, Agent, or Firm*—Pillsbury Winthrop Shaw Pittman, LLP

(57) ABSTRACT

An apparatus for pulling single crystal comprises a quartz crucible provided in a chamber for storing raw melt of a single crystal, a heater that heats the raw melt of the single crystal, and a crucible driving unit that rotates the quartz crucible. A quartz crucible deformation prevention unit using an arm or gas blowout is provided in the chamber, whereby deformation of a wall part of the quartz crucible during manufacture thereof can be prevented, and a deformed quartz crucible can be repaired.

12 Claims, 8 Drawing Sheets

APPARATUS FOR PULLING SINGLE CRYSTAL

BACKGROUND OF THE INVENTION

1. Field of the Invention

The present invention relates to an apparatus for pulling single crystal, and more particularly relates to technology for preventing deformation of a wall part of a quartz crucible provided to an apparatus for pulling silicon single crystal, and repairing the deformed wall part.

Priority is claimed on Japanese Patent Application No. 2004-158983, filed May 28, 2004, the content of which is incorporated herein by reference.

2. Description of Related Art

Generally, in an apparatus for pulling silicon single crystal using Czochralski method, the pressure inside a high pressure-proof airtight chamber is reduced and fresh argon (Ar) gas is flowed therein, a polycrystalline raw material in a quartz crucible provided in the lower part of the chamber is heated and melted, a seed crystal is dipped into the surface of the melt from above, and the seed crystal is pulled while rotating the seed crystal and the quartz crucible and moving them up and down, whereby a single crystal (ingot) comprising a conical upper cone part having a protruding top end, a cylindrical body part, and a conical lower cone part having a protruding bottom end, is grown below the seed crystal.

In pulling a silicon single crystal, to heat the polycrystalline raw material of the silicon in the quartz crucible, the quartz crucible is heated by a heater arranged around the quartz crucible, thereby indirectly heating the polycrystalline raw material.

Silicon has a high melting point of 1420° C., and, when the silicon raw material is completely melted, the temperature of the quartz crucible also exceeds this melting point. At this temperature, the quartz crucible itself softens and is deformed easily by the tare weight of its wall part. As shown in FIG. 12, this deformation is such that the wall part of the quartz crucible 73 inwardly collapses, so that its top end drops to a lower position than usual. In FIG. 12, reference numeral 72 represents a silicon melt. Since the outer face of the quartz crucible is usually covered by a graphite susceptor, the softened wall part collapses inwardly.

The collapse of the quartz crucible 73 may obstruct the upward rise of the crucible during subsequent crystal growth, or contact a heat shield member (heat cap) arranged around the seed crystal and a single crystal that grows below the seed crystal, making pulling difficult, or disrupt the flow of gas, or obstruct good single crystal growth. For these reasons, pulling of the silicon single crystal is terminated when a collapse occurs.

Conventional methods for repairing deformation of a quartz crucible include a method of controlling the number of rotations of the crucible and controlling the surface temperature of the melt (e.g. Patent Reference 1: Japanese Unexamined Patent Application, First Publication No. 2000-7496), suppressing deformation by pasting barium over the surface of the crucible, or increasing the softening point of the crucible by adding impurities such as aluminum when forming the quartz crucible.

However, the method of repairing by controlling the rotation of the crucible and the melt surface temperature obtains poor results, and makes it difficult to sufficiently return the wall part to its original shape. While the methods of pasting barium over the surface of the crucible and adding impurities to the crucible make the crucible less likely to deform, there is a problem that the impurities may infiltrate the crystal.

The present invention has been realized with regard to the aforesaid problems, and aims to provide an apparatus for pulling single crystal that can prevent deformation of a quartz crucible that may occur during the process of manufacturing single crystal, and, if the quartz crucible does deform, can repair the deformed quartz crucible to its original shape without obstructing pulling of the single crystal.

SUMMARY OF THE INVENTION

An apparatus for pulling single crystal of this invention includes a quartz crucible provided in a chamber for storing raw melt of a single crystal, a heater that heats the raw melt of the single crystal, and a crucible driving unit that rotates the quartz crucible. A quartz crucible deformation prevention unit for preventing and/or repairing deformation of a wall part of the quartz crucible is provided in the chamber. By this apparatus the problems mentioned above were solved.

A pressing unit, capable of pressing the wall part of the quartz crucible from the inside, may be used as the quartz crucible deformation prevention unit.

Acceptably, the quartz crucible deformation prevention unit is an arm having a support rod, that can be lifted up and down, and a protrusion, that is provided at a tip of the support rod and protrudes in one direction away from the support rod. The pressing unit may comprise a pressing face capable of pressing the wall part of the quartz crucible from the inside, fitted to the protrusion.

The quartz crucible deformation prevention unit may be a gas blowout unit comprising a gas supply pipe, that can be lifted up and down, and a gas blow outlet, that is provided at the bottom end of the gas supply pipe as the pressing unit. The gas blow outlet is arranged so as to blow inert gas to the inside face of the wall part of the quartz crucible by operating the gas supply pipe, the gas pressure of the inert gas blown from the blow outlet being capable of pressing the wall part of the quartz crucible from the inside.

A cooling mechanism may be provided around the gas supply pipe.

In another aspect, an apparatus for pulling single crystal of this invention comprises a quartz crucible provided in a chamber for storing raw melt of a single crystal, a heater that heats the raw melt of the single crystal, and a crucible driving unit that rotates the quartz crucible, a quartz crucible deformation prevention unit for preventing and/or repairing deformation of a wall part of the quartz crucible being provided in the chamber, and the quartz crucible deformation prevention unit comprising a gas blowing unit that prevents deformation of the wall part by blowing inert gas against the wall part of the quartz crucible, thereby lowering the temperature of the wall part. This solves the problems mentioned above.

A cooling mechanism may be provided around the gas blowing unit.

The quartz crucible deformation prevention unit may be equipped with both functions of pressing the crucible wall part by using gas blowout, and cooling the crucible wall part by using gas blowing.

Acceptably, the crucible driving unit is fitted with a crucible lifting unit that lifts the quartz crucible up and down. The quartz crucible deformation prevention unit is fitted with a lifting unit that is synchronized with the lifting of the quartz crucible.

In the apparatus for pulling single crystal comprising a quartz crucible provided in a chamber for storing raw melt of a single crystal, a graphite crucible surrounding external periphery of the quartz crucible, a heater that surrounds external periphery of the graphite crucible and heats the raw melt of the single crystal, and a crucible driving unit that rotates the quartz crucible, a quartz crucible deformation prevention unit for preventing and/or repairing deformation of a wall part of the quartz crucible is provided in the chamber, enabling deformation of the wall part of the quartz crucible to be prevented, and enabling deformation to be repaired, even while pulling the single crystal. Accordingly, even when the quartz crucible deforms, it is possible to continue and complete pulling of the single crystal, which is not conventionally possible, whereby the manufacturing cost of the pulled single crystal product can be reduced. Even when the wall part of the quartz crucible deforms, it is possible to reduce the effect of the deformed wall part on the melt surface and prevent any reduction in the level of the single crystal product. The quartz crucible deformation prevention unit can effectively deal with crucible deformation in an initial heating stage, and deformation such as collapse of the wall part arising after prolonged use.

The quartz crucible deformation prevention unit may be provided in the chamber, with the bottom end of the quartz crucible deformation prevention unit positioned at the upper side of the surface of the raw melt of the single crystal stored in the quartz crucible. A gap is provided between the bottom end and the wall part and at the horizontal direction inner side of the quartz crucible. A pressing unit is capable of pressing the wall part of the quartz crucible from the inside, and is provided at the bottom end of the quartz crucible deformation prevention unit. The pressing unit prevents deformation of the wall part of the quartz crucible, or repairs the deformed wall part, by pressing against the wall part when the wall part deforms, or when the wall part softens and is in danger of deforming. It therefore becomes possible to press the inside of the wall part of the quartz crucible and return it to a shape that runs along the graphite crucible side of the quartz crucible outer side.

The quartz crucible deformation prevention unit may be an arm that is arranged vertically inside the chamber. The arm has a support rod that can be lifted up and down, or also rotated and moved horizontally. A protrusion is formed at the bottom end of the support rod and protrudes in a direction away from the rotational axis of the support rod. The protrusion has a pressing face, that is capable of pressing the wall part of the quartz crucible from the inner side by the operation of the support rod, as a pressing unit. By lowering the support rod of the arm until its bottom end reaches a predetermined position, the pressing face can be pressed against the quartz crucible wall part, preventing and/or repairing deformation. At this time, when the arm is lowered until its bottom end reaches a predetermined position in a horizontal plane, the quartz crucible is rotated so that its deformed wall part directly contacts the pressing face.

The arm may have a support rod that, in addition to being able to be lifted up/down, can also be rotated and moved horizontally. When the pressing face does not directly contact the wall part merely by lowering the support rod, this arm allows the support rod to be rotated so that the pressing face can be set at a position where it directly contacts the deformed wall part. Since there is considerable freedom with regard to the installation position of the quartz crucible deformation prevention unit with respect to the quartz crucible and the single crystal being pulled, when the wall part is not deformed in the chamber, the quartz crucible deformation prevention unit can be stored/installed at a position that does not affect the pulling of the single crystal.

The quartz crucible deformation prevention unit may be a gas blowout unit comprising a gas supply pipe, that is suspended in the chamber and can be lifted up/down, and a gas blow outlet, that is provided at the bottom end of the gas supply pipe as the pressing unit. By the operation of the gas supply pipe, the blow outlet is arranged at a position where inert gas can be blown against the inner face of the wall part of the quartz crucible. This makes it possible to press the wall part of the quartz crucible from its inner side by using gas pressure of the inert gas. Accordingly, by lowering the gas supply pipe and arranging its bottom end at a predetermined position, inert gas can be blown from the gas blow outlet and pressed against the wall part of the quartz crucible, enabling deformation of the crucible to be prevented/repaired. When the gas blow outlet is made to face the wall part side and the gas supply pipe is lowered so that its bottom end is at a predetermined position in a horizontal plane, the rotation of the quartz crucible arranges the deformed wall part at a position where it can be pressed by the inert gas being blown.

Acceptably, in addition to being able to be lifted up/down, the gas supply pipe can also rotate and move horizontally. When the inert gas does not strike the wall part merely by lowering the gas supply pipe, by rotating the gas supply pipe, the gas blow outlet can be arranged at a position from where gas can be blown against the deformed wall. Since there is considerable freedom with regard to the installation position of the quartz crucible deformation prevention unit with respect to the quartz crucible and the single crystal being pulled, when the wall part is not deformed in the chamber, the quartz crucible deformation prevention unit can be stored/installed at a position that does not affect the pulling of the single crystal.

A cooling mechanism may be provided around the gas supply pipe in the quartz crucible deformation prevention unit. The cooling mechanism can prevent the inert gas from becoming hot in the gas supply pipe inside the hot chamber, thereby making it possible to repair the deformed wall part by blowing inert gas against it, and, in addition, to lower the temperature of a soft wall part that is liable to deform, thereby hardening it and preventing deformation.

An apparatus for pulling single crystal of this invention comprises a quartz crucible provided in a chamber for storing raw melt of a single crystal, a heater that is provided around the outer peripheral face of the quartz crucible and heats the raw melt of the single crystal, and a crucible driving unit that rotates the quartz crucible. An arm for preventing and/or repairing deformation of a wall part of the quartz crucible (sometimes termed an arm for preventing deformation) is provided above the surface of the raw melt of the single crystal stored in the quartz crucible, with a gap between the arm and the wall part. The arm has a support rod, that can be rotated and moved horizontally, and can also be lifted up/down, and a protrusion, that is provided at a tip of the support rod, and the protrusion has a pressing face, that can be pressed against the wall part of the quartz crucible from the inside by operating the support rod. This solves the above-mentioned problems.

According to the apparatus for pulling single crystal of this configuration, by lifting the support rod of the arm for preventing deformation up/down, the tip of the support rod can be arranged at a predetermined position above the surface of the raw melt of the single crystal stored in the crucible (near a location where there is a danger of deformation of the wall part due to softening during the process of pulling the single crystal, or a location where such deformation has occurred) with a gap between the tip and the inside face of the wall part of the crucible.

When the tip of the support rod is arranged at the predetermined position, by rotating the support rod and moving it horizontally, the pressing face of the protrusion provided at the tip of the support rod can be made to face and touch the inner side of the wall part of the quartz crucible, that is being rotated by the motor for rotating, thereby scanning the inner side of the wall part and pressing the wall part from the inside, making it possible to repair/prevent deformation caused by collapse and the like of the wall part of the quartz crucible during the process of pulling the single crystal. Such operation of the arm for preventing-deformation of the wall part of the crucible may be performed before heating the crucible or softening of the crucible.

Since the tip of the support rod of the arm for preventing deformation can be arranged near the deformation due to collapse of the like (deformed part), by rotating the support rod and moving it horizontally, it is possible to scan the inner side of the wall part and press it from the inside, thereby repairing only the deformed part of the wall part.

At the time of preventing or repairing deformation in the wall part of the quartz crucible by using the arm for preventing deformation, breakage of the crucible and changes in its thickness can be prevented by arranging the protrusion at a position where it does not excessively press against the inner side of the wall part.

When fitted to the apparatus for pulling single crystal, the arm for preventing deformation of the above configuration can easily repair deformation of the crucible wall part, since its pressing pressure against the inner face of the crucible wall part and pressing distance thereto can be adjusted.

Another aspect of the apparatus for pulling single crystal of this invention comprises a quartz crucible provided in a chamber for storing raw melt of a single crystal, a heater that heats the raw melt of the single crystal, and a crucible driving unit that rotates the quartz crucible, a quartz crucible deformation prevention unit for preventing and/or repairing deformation of a wall part of the quartz crucible being provided in the chamber, and a gas blowout unit (sometimes termed a gas blowout unit for preventing deformation) that prevents and/or repairs deformation of the wall part of the quartz crucible. The gas blowout unit is provided above the surface of the raw melt of the single crystal stored in the quartz crucible, with a gap between the gas blowout unit and the wall part. In the apparatus for pulling single crystal, the gas blowout unit comprises a gas supply pipe, that can be rotated and moved horizontally, and can also be lifted up/down, and a gas blow outlet provided at the tip of the gas supply pipe, the configuration being such that the gas blow outlet can be arranged near the inner face of the wall part of the quartz crucible by operating the gas supply pipe, enabling the wall part to be pressed from the inside by the gas pressure of inert gas that is blown from the gas blow outlet. This arrangement can solve the above-mentioned problems.

According to the apparatus for pulling single crystal of the above configuration, by lifting the gas supply pipe of the gas blowout unit for preventing deformation up/down, the tip of the gas supply pipe can be arranged with a gap between it and the wall part inner face of the quartz crucible, and at a predetermined position above the surface of the raw melt of the single crystal stored in the crucible (near a location where there is a danger of deformation in the wall part of the crucible due to softening during the process of pulling the single crystal, or near a location where the wall part is deformed).

When the tip of the gas supply pipe is arranged at the predetermined position, by rotating the gas supply pipe and moving it horizontally, the pressing face of the protrusion provided at the tip of the gas supply pipe can be made to face the inner side of the wall part of the rotating quartz crucible, and blow an inert gas (a gas that is inert with respect to the melt and the crucible) such as Argon gas against the inner face of the wall part, thereby scanning the inner side of the wall part with the inert gas and suppressing any temperature rise of the crucible, and pressing the wall part from the inside with the gas pressure; this makes it possible to prevent deformation caused by collapse and the like of the wall part of the quartz crucible during the process of pulling the single crystal. The operation of using the gas blowout unit for preventing deformation to prevent deformation of the crucible may be performed before heating the crucible, or before the crucible softens.

Since the tip of the gas supply pipe of the gas blowout unit for preventing deformation can be arranged near the deformation due to collapse or the like (deformed part), by rotating the gas supply pipe and moving it horizontally it is possible to make the gas blow outlet face the wall part inner face side of the rotating quartz crucible, blow the inert gas against the wall part inner face, scanning the inner side of the wall part and pressing it from the inside with gas pressure, and thereby repairing only the deformed part of the wall part without touching the wall part of the crucible.

In the apparatus for pulling single crystal of the configuration described above, a cooling mechanism may be provided around the gas supply pipe.

According to the apparatus for pulling single crystal of this configuration, since inert gas supplied in the gas supply pipe can be cooled, by blowing the cooled inert gas from the gas blow outlet against the wall part inner face, a predetermined position on the wall part of the crucible can be cooled, enhancing the crucible deformation-prevention and reparation effects.

In the apparatus for pulling single crystal according to any of the configurations described above, the crucible driving unit may be fitted with a crucible lifting unit that lifts the quartz crucible up/down, and a lifting unit that is synchronized with the lifting of the quartz crucible may be fitted to the support rod or the gas supply pipe as a quartz crucible deformation prevention unit.

Accordingly, since the quartz crucible deformation prevention unit can be moved up/down while tracking the up/down position of the crucible in whatever state, irrespective of the up/down position of the crucible changing as the single crystal is pulled, it becomes possible to prevent the changing shape of the quartz crucible wall part from affecting the raw melt, ensuring that the single crystal pulling has high yield.

For example, immediately following the start of pulling, since the raw material must be melted, the temperature of the quartz crucible is higher than when pulling the trunk part, and the wall part is softer and more liable to collapse. There are cases where, since there is less raw melt in the quartz crucible when pulling is nearly completed, there is less pressure from the melt against the wall part, and the height occupied by the quartz crucible wall part on the inside is greater, whereby the wall part is more liable to inwardly collapse than when the quartz crucible contains a large amount of melt. For example, in any of these states, or in states midway therebetween, deformation of the wall part can be prevented by pressing or cooling the most appropriate section of wall parts having different heights, and the single crystal can be completely manufactured to a predetermined length.

According to the silicon single crystal of this invention, it is possible to prevent deformation of a quartz crucible that is likely to occur during the manufacturing process of a single crystal, and repair a quartz crucible that has deformed. The apparatus for pulling single crystal of this invention is especially effective in cases where a single crystal is pulled for a long time, such as multi-pulling. This invention is effective, since single crystal pulling is processed at extremely high temperature and in a narrow space.

DETAILED DESCRIPTION OF THE INVENTION

A first embodiment of the apparatus for pulling single crystal according to this invention will be explained based on the drawings.

First Embodiment

Figure 1:
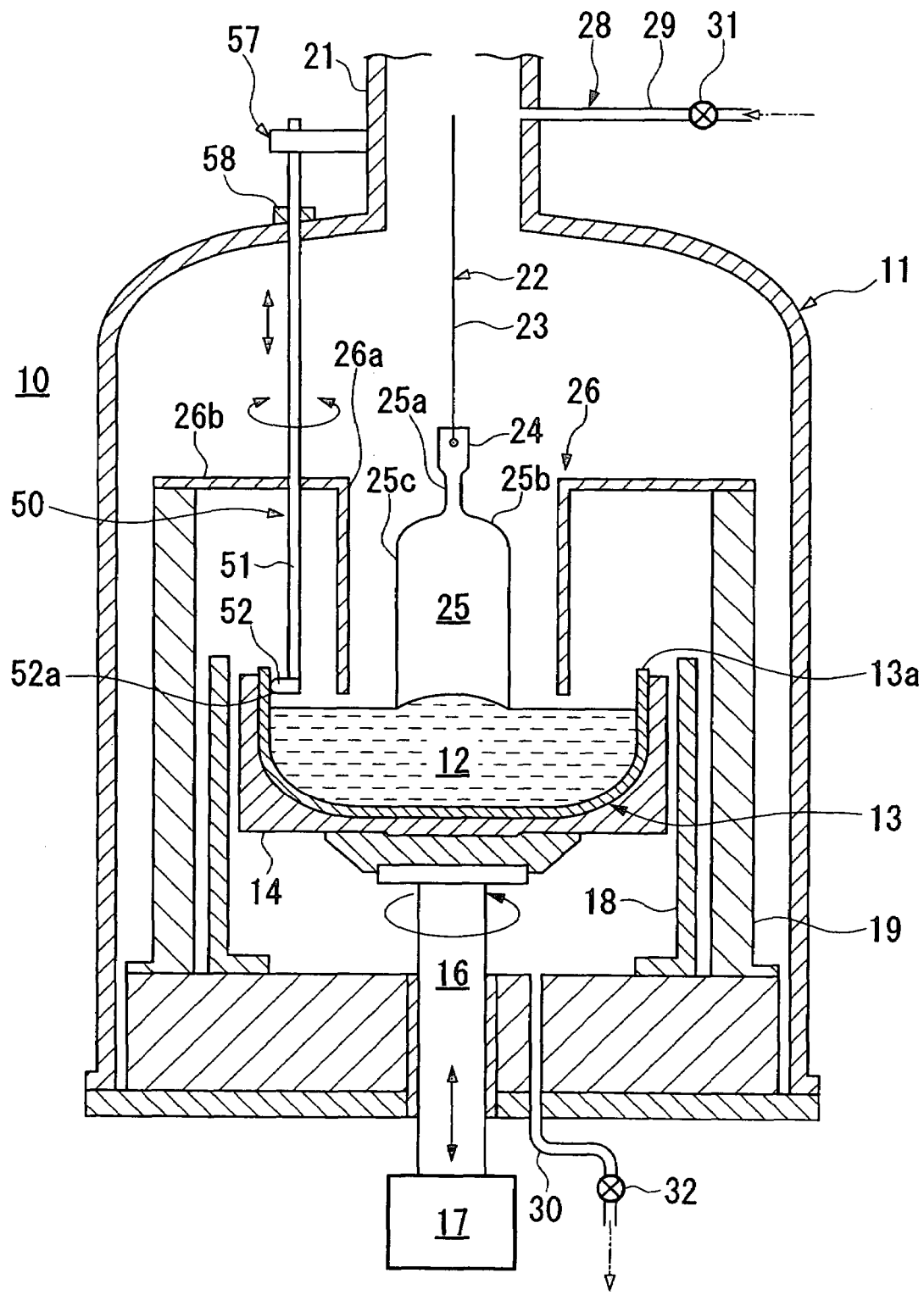
FIG. 1 is a schematic diagram of a first embodiment of the apparatus for pulling single crystal according to this invention.

As shown in FIG. 1, a quartz crucible 13 stores a silicon melt constituting raw material of a silicon single crystal, and is provided in a chamber 11 of an apparatus for pulling single crystal 10 according to a first embodiment of this invention, the outer face of the quartz crucible 13 being covered by a graphite susceptor (graphite crucible) 14. A bottom face of the quartz crucible 13 is secured via the graphite susceptor 14 to a top end of a supporting axis 16, and a bottom part of the supporting axis 16 is connected to a crucible-driving unit 17. The crucible-driving unit 17 includes an unillustrated first motor for rotation that rotates the quartz crucible 13, and an unillustrated motor for lifting crucible as a crucible-lifting unit that lifts the quartz crucible 13 up/down. The motors allow the quartz crucible 13 to be rotated in a predetermined direction and lifted up and down. The outer peripheral face of the quartz crucible 13 is surrounded by a heater 18, arranged at a predetermined distance from the quartz crucible 13, and the heater 18 is surrounded by a thermal insulation cylinder 19. The heater 18 heats and melts a high-purity polycrystalline silicon body placed in the quartz crucible 13 to form a silicon melt 12.

A round cylindrical casing 21 is connected to the top end of the chamber 11. A pulling unit 22 is fitted to the casing 21. The pulling unit 22 includes an unillustrated pulling head provided horizontally at the top end of the casing 21 and to be able to revolve, an unillustrated second motor for rotation that rotates the head, a wire cable 23 that hangs from the head toward the rotational center of the quartz crucible 13, and an unillustrated motor for pulling that is provided inside the head and reels the wire cable 23 in and out. A seed crystal 24 for immersing in the silicon melt 12 and then pulling a silicon single crystal rod 25 is attached to the bottom of the wire cable 23.

A heat shield member (heat cap) 26 is provided between the outer peripheral face of the silicon single crystal rod 25 and the inner peripheral face of a wall part 13a of the quartz crucible 13. The heat shield member 26 has a round cylindrical part 26a that shuts out radiant heat from the heater 18, and a flange part 26b that is arranged on the top edge of the cylindrical part 26a and extends outwardly in an approximately horizontal direction. By mounting the flange part 26b on the thermal insulation cylinder 19, the heat shield member 26 is secured inside the chamber 11 so that the bottom edge of the cylindrical part 26a is at a predetermined distance above the surface of the silicon melt 12.

As quartz crucible deformation prevention unit, an arm (arm for preventing deformation) 50 for preventing and/or repairing deformation of the wall part 13a of the quartz crucible 13 is provided above the surface of the silicon melt 12 stored in the quartz crucible 13, between the outer peripheral face of the silicon single crystal rod 25 and the inner peripheral face of the wall part 13a of the quartz crucible 13 (more precisely, above the surface of the silicon melt 12 stored in the quartz crucible 13, between the heat shield member 26 and the inner peripheral face of the wall part 13a). The arm for preventing deformation 50 is usually (i.e. when not preventing or repairing deformation of the wall part 13a) arranged at a distance from the wall part 13a.

The arm for preventing deformation 50 includes a support rod 51 that can rotate and move up and down, and a protrusion 52 formed at the tip (bottom end) of the support rod 51, the protrusion 52 having a pressing face 52*a* that presses against the wall part 13*a* of the quartz crucible 13 from the inside when the support rod 51 is operated.

The top of the support rod 51 leads outside the chamber 11, and is connected to an arm driving unit 57. The arm driving unit 57 includes an unillustrated motor for rotating the support rod 51, and an unillustrated motor for lifting the support rod up and down. These motors allow the support rod 51 to be rotated in a predetermined direction and lifted up and down. A chamber attachment part on top of the support rod 51 is sealed by a sealing member 58.

Preferably, at least the portion of the arm for preventing deformation 50 that enters the thermal insulation cylinder 19 should be formed from a heat-resistant material. More precisely, at least the protrusion 52 and the tip of the support rod 51 should preferably be formed from a highly heat-resistant material such as carbon, quartz, or molybdenum.

The support rod 51 of the arm for preventing deformation 50 is configured so that it can operate in synchronism with the up/down movement of the quartz crucible 13.

The chamber 11 connects to a gas supply/discharge unit 28, that supplies inert gas to the silicon single crystal side of the chamber 11 and discharges the inert gas from the crucible inner periphery side of the chamber 11. The gas supply/discharge unit 28 includes a supply pipe 29, one end of which is connected to the peripheral wall of the casing 21 and another end is connected to an unillustrated tank that stores the inert gas, and a discharge pipe 30, one end of which is connected to the bottom wall of the chamber 11 and another end is connected to an unillustrated vacuum pump. The supply pipe 29 and the discharge pipe 30 are respectively fitted with first and second flow adjustment valves 31 and 32 for adjusting the flow of inert gas along the pipes 29 and 30.

An unillustrated rotary encoder is fitted to an unillustrated output axis of the motor for pulling of the pulling unit 22, and the crucible-driving unit 17 is fitted with an unillustrated weight sensor, that detects the weight of the silicon melt 12 in the quartz crucible 13, and a linear encoder that detects the lift position of the support axis 16. The detect outputs of rotary encoder, the weight sensor, and the linear encoder connect to control inputs of an unillustrated controller, and control outputs of the controller connect respectively to the motor for pulling of the pulling unit 22, the motor for lifting crucible of the crucible-driving unit 17, and the motor for lifting support rod of the arm driving unit 57.

The controller has an unillustrated memory that stores the reel length of the wire cable 23 with respect to the detect output of the rotary encoder (i.e. the pulling length of the silicon single crystal rod 25) as a first map, and stores the liquid level of the silicon melt 12 inside the quartz crucible 13 with respect to the detect output of the weight sensor as a second map.

Based on the detect output of the weight sensor, the controller controls the motor for lifting of the crucible-driving unit 17 so that the liquid level of the silicon melt 12 inside the quartz crucible 13 is always kept at a fixed level.

Subsequently, a method for pulling silicon single crystal using the apparatus for pulling single crystal 10 of this embodiment will be explained.

As shown in FIG. 1, a high-purity polycrystalline silicon body is placed in the quartz crucible 13, and the heater 18 heats and melts the high-purity polycrystalline silicon body to form the silicon melt 12. After the polycrystalline silicon body melts and the silicon melt 12 accumulates in the quartz crucible 13, inert gas is supplied into the casing 21 by opening the first and second flow adjustment valves 31 and 32, and gas that evaporates from the surface of the silicon melt 12 is discharged via the discharge pipe 30 together with the inert gas.

The motor for pulling, provided in the pulling unit 22, is used to reel out the wire cable 23 and lower the seed crystal 24 until the tip of the seed crystal 24 touches the silicon melt 12. The seed crystal 24 is pulled gradually so that a seed aperture part 25*a* is formed, and then pulled further to grow a shoulder part 25*b* below the seed aperture part 25*a*. After the shoulder part 25*b* is grown, the seed crystal 24 is pulled further to form a trunk part 25*c* below the shoulder part 25*b*.

Figure 2:
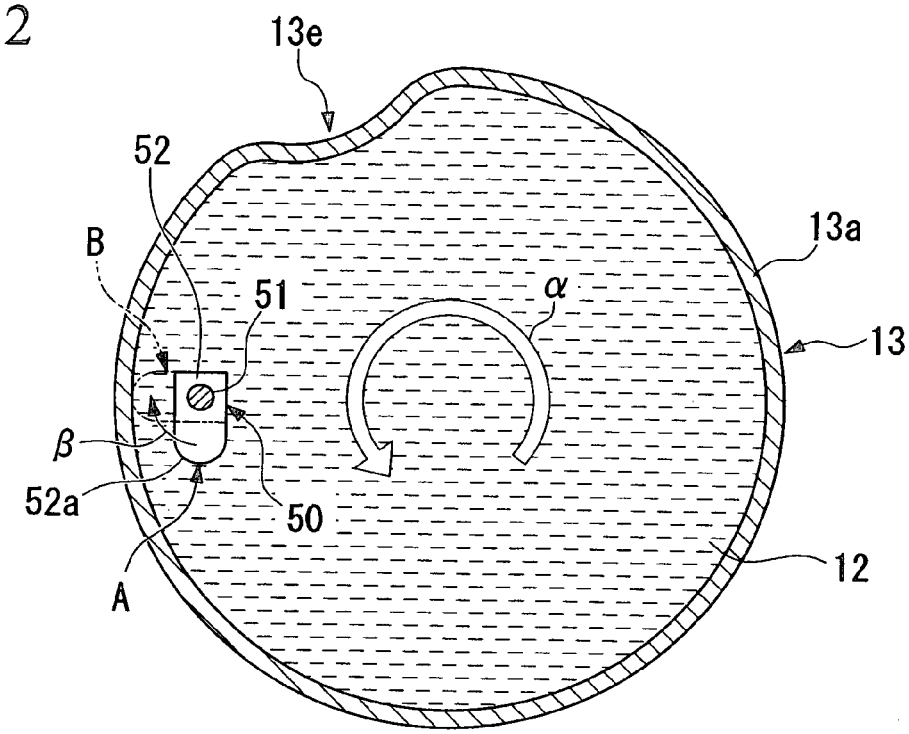
FIG. 2 is a diagram illustrating a method for repairing deformation of a crucible by using the apparatus for pulling single crystal of FIG. 1, being a horizontal cross-sectional view of a quartz crucible and an arm for preventing deformation.
Figure 4:
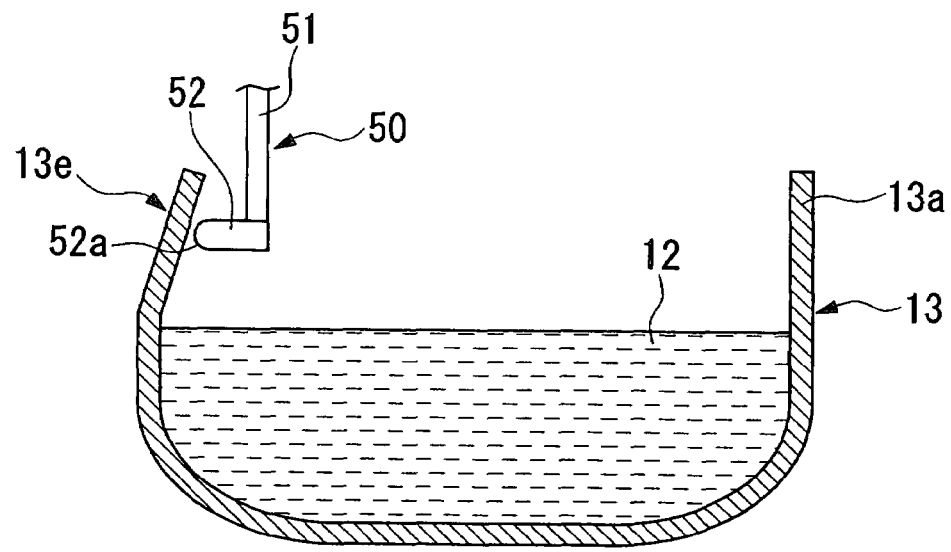
FIG. 4 is a diagram illustrating a method for repairing deformation of a crucible by using the apparatus for pulling single crystal of FIG. 1, being a vertical cross-sectional view of a quartz crucible and an arm for preventing deformation.

When a deformed part such as that shown in FIGS. 2 and 4 appears in the quartz crucible 13 due to softening while forming the trunk part 25*c*, the support rod 51 of the arm for preventing deformation 51 is lifted up and down by the motor for lifting support rod so that there is a gap between the tip of the support rod 51 and the inner side of the wall part of the quartz crucible 13 (the position indicated by solid line A in FIG. 2), and the tip reaches a predetermined position above the surface of the silicon melt 12 stored in the quartz crucible as shown in FIG. 4 (beside the deformation in the wall part 13*a* of the quartz crucible 13 due to softening while pulling the single crystal).

Figure 3:
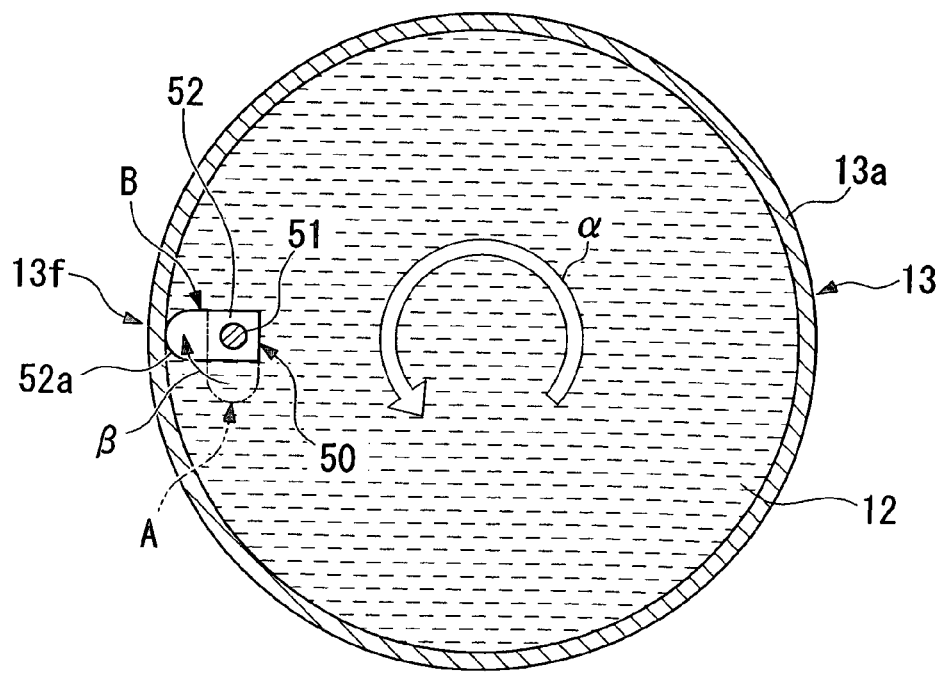
FIG. 3 is a diagram illustrating a method for repairing deformation of a crucible and a method for preventing deformation by using the apparatus for pulling single crystal of FIG. 1, being a horizontal cross-sectional view of a quartz crucible and an arm for preventing deformation.
Figure 5:
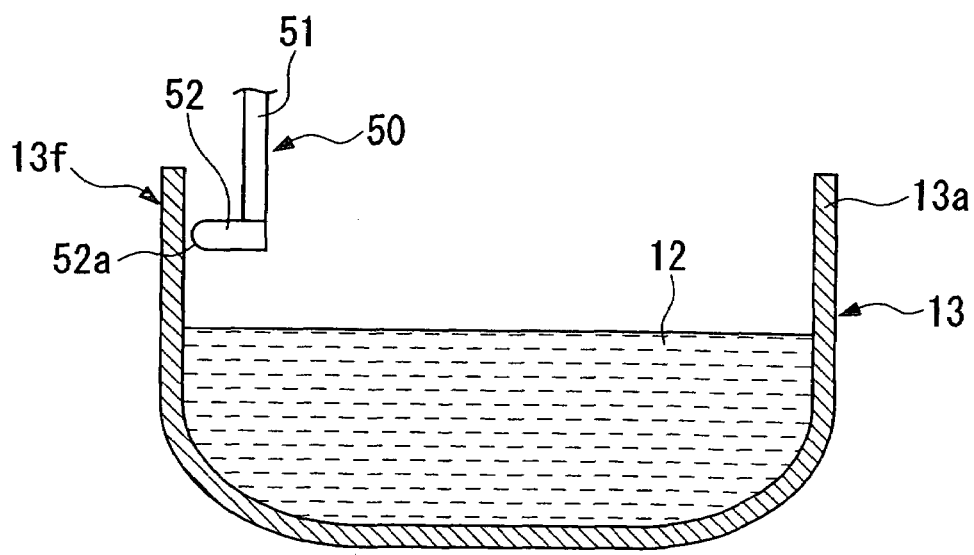
FIG. 5 is a diagram illustrating a method for repairing deformation of a crucible and a method for preventing deformation by using the apparatus for pulling single crystal of FIG. 1, being a vertical cross-sectional view of a quartz crucible and an arm for preventing deformation.

When the tip of the support rod 51 is positioned beside the deformed part 13*e*, the motor for rotating support rod rotates the support rod 51 in a clockwise direction β so that the pressing face 52*a* of the protrusion 52 at the tip of the support rod 51 is made to face and touch the inner side of the wall part of the quartz crucible 13 (the position indicated by dotted line B in FIG. 2), that is being rotated in a counterclockwise direction α by the motor for rotating, thereby scanning the inner side of the wall part and pressing the wall part from the inside, making it possible to repair deformation caused by collapse and the like of the wall part 13*a* of the quartz crucible 13 while pulling the single crystal, as shown in FIGS. 3 and 5.

When there is a danger of deformation in the wall part 13*a* of the quartz crucible 13 due to softening while forming the trunk part 25*c*, the motor for lifting support rod is used to lift the support rod 51 of the arm for preventing deformation 50 up/down so that there is a gap between the tip of the support rod 51 and inner side of the wall part of the quartz crucible 13 (the position indicated by solid line A in FIG. 3) and the tip reaches a predetermined position above the surface of the silicon melt 12 stored in the quartz crucible as shown in FIG. 5 (beside a location 13*f* where there is a danger of deformation in the wall part 13*a* of the quartz crucible 13 due to softening while pulling the single crystal).

When the tip of the support rod 51 is positioned beside the location 13*f* where there is a danger of deformation, the motor for rotating support rod rotates the support rod 51 in a clockwise direction β so that the pressing face 52*a* of the protrusion 52 at the tip of the support rod 51 is made to face and touch the inner side of the wall part of the quartz crucible 13 (the position indicated by solid line B in FIG. 3), that is being rotated in a counterclockwise direction α by the motor for rotating, thereby scanning the inner side of the wall part and pressing the wall part from the inside, making it possible to prevent deformation caused by collapse and the like of the wall part 13*a* of the quartz crucible 13 while pulling the single crystal.

The operation of using the arm for preventing deformation 50 to prevent deformation of the wall part of the quartz crucible 13 may be performed before heating the quartz crucible 13 or before it softens.

As the trunk part 25c grows, the surface of the silicon melt 12 descends, and an unillustrated motor for lifting crucible lifts the quartz crucible 13 upwards in accordance with the decrease in the amount of silicon melt 12, holding the surface of the silicon melt 12 at a predetermined position while it descends with the pulling of the seed crystal 24.

While this embodiment includes a rotatable support rod 51 fitted to the arm for preventing deformation 50 in the apparatus for pulling single crystal, it is acceptable for the support rod 51 to move horizontally instead.

While the heat shield member 26 of this embodiment is not equipped with a lifting function, one may be provided.

Figure 6:
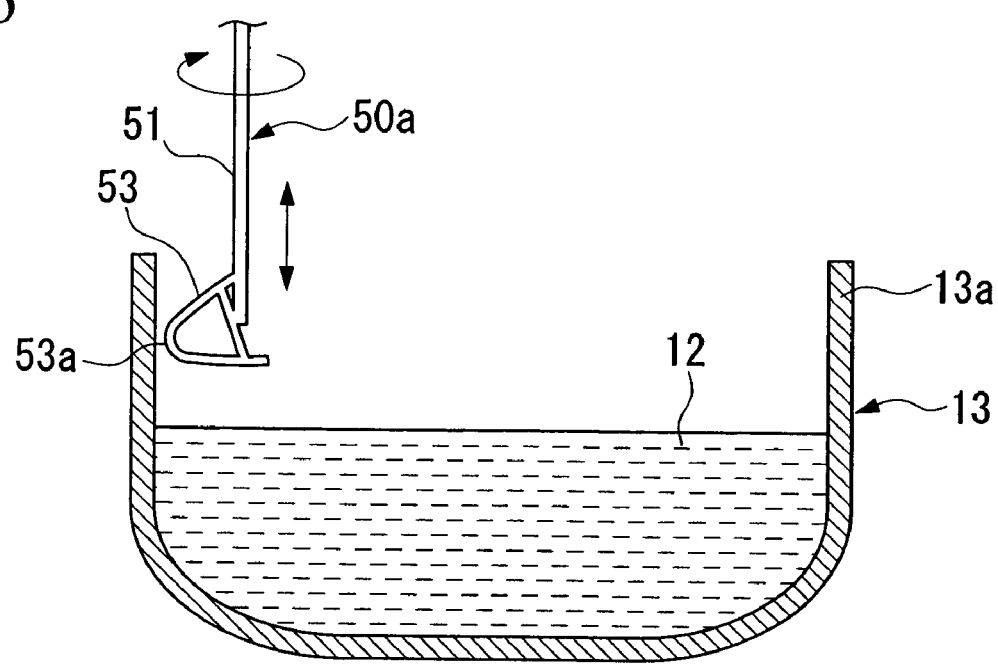
FIG. 6 is a cross-sectional view of another embodiment of an arm for preventing deformation fitted to an apparatus for pulling single crystal.

The arm for preventing deformation that is fitted to the apparatus for pulling silicon single crystal as quartz crucible deformation prevention unit may be an arm for preventing deformation 50a as shown in FIG. 6. The arm for preventing deformation 50a differs from the arm for preventing deformation 50 shown in FIG. 1 in that a protrusion 53 formed on the tip of the support rod 51 is U-shaped (bail-like shaped) in vertical cross-section, and a pressing face 53a is formed on the outer face of the protrusion 53. The shape of the protrusion 53 need not be symmetrical in the up-down direction with respect to the horizontal plane, and may instead have a downward-slanting tip as shown in FIG. 6. This shape enables the arm for preventing deformation 50a to be lowered without affecting the silicon melt 12 by touching it or the like, and enables deformation of the wall part 13 to be repaired from the lower side (the silicon melt 12 side).

A second embodiment of the apparatus for pulling single crystal according to this invention will be explained based on the drawings.

Second Embodiment

Figure 7:
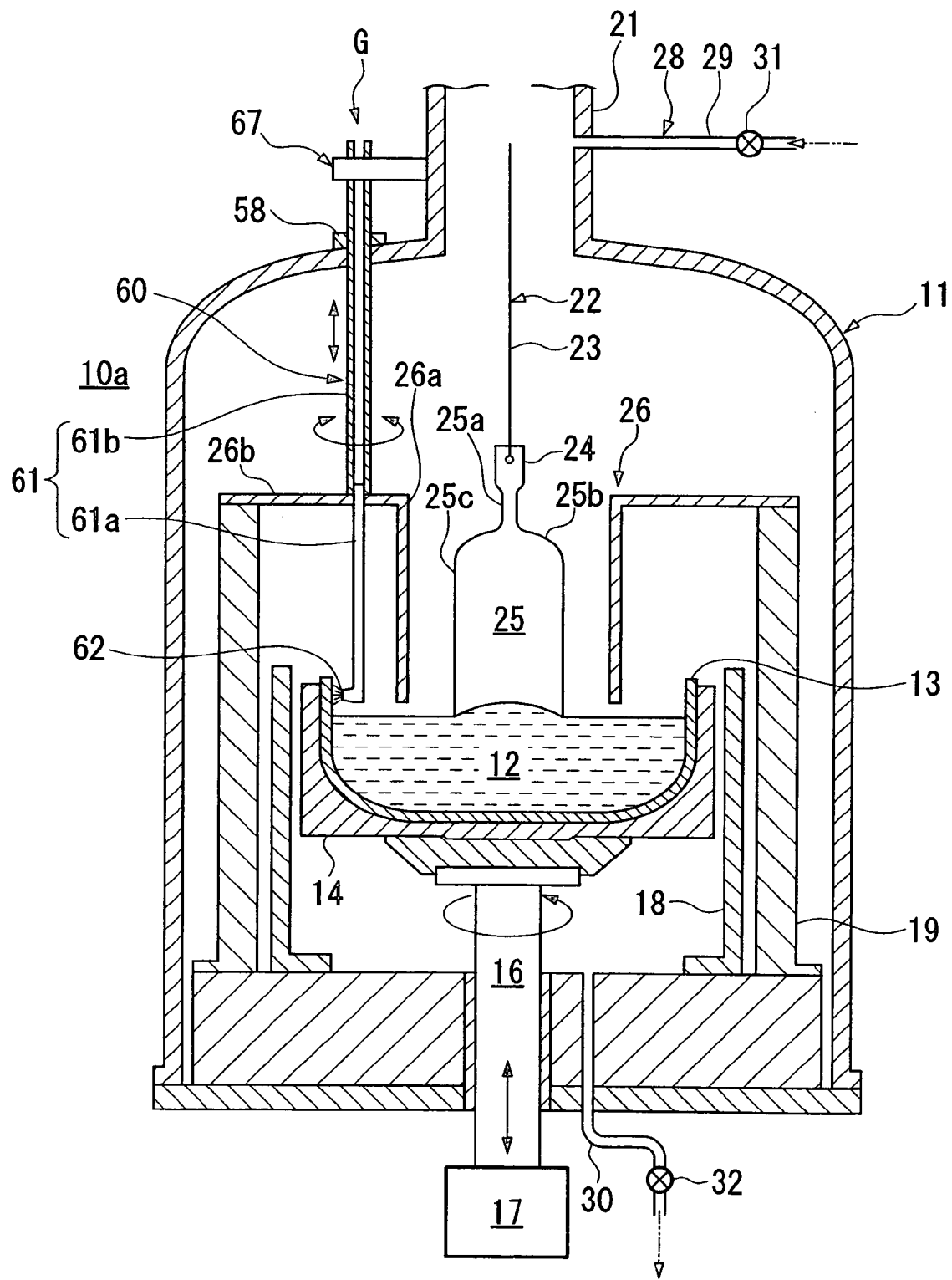
FIG. 7 is a schematic diagram of a second embodiment of the apparatus for pulling single crystal according to this invention.

FIG. 7 is a schematic diagram of an apparatus for pulling silicon single crystal 10a according to a second embodiment of this invention.

The particular difference between the apparatus for pulling silicon single crystal 10a of this embodiment and the apparatus for pulling silicon single crystal 10 of the first embodiment shown in FIG. 1 is that this embodiment is fitted with a deformation prevention gas blowout unit 60, instead of an arm for preventing deformation as quartz crucible deformation prevention unit.

The deformation prevention gas blowout unit 60 is provided above the surface of the silicon melt 12 stored in the quartz crucible 13, between the outer peripheral face of the silicon single crystal rod 25 and the inner peripheral face of the wall part 13a of the quartz crucible 13 (more precisely, above the surface of the silicon melt 12 stored in the quartz crucible 13, between the heat shield member 26 and the inner peripheral face of the wall part 13a). The deformation prevention gas blowout unit 60 is usually (i.e. when not preventing or repairing deformation of the wall part 13a) arranged at a distance from the wall part 13a.

The deformation prevention gas blowout unit 60 includes a gas supply pipe 61 that can be rotated and lifted up/down, and a gas blow outlet 62 provided in the tip (lower part) of the gas supply pipe 61. The gas blow outlet 62 is arranged near the inner face of the wall part of the quartz crucible 13 by operating the gas supply pipe 61, and enables the wall part 13a of the quartz crucible 13 to be pressed from the inside by gas pressure of inert gas G such as argon gas blown out through the blow outlet.

The gas supply pipe 61 includes a lower gas supply pipe 61a that corresponds to the section inserted into the thermal insulation cylinder 19, and an upper gas supply pipe 61b that corresponds to the section outside the thermal insulation cylinder 19. The upper part of the gas supply pipe 61b leads outside the chamber 11. The upper part of the upper gas supply pipe 61b connects to a drive unit 67 of the gas blow unit. The drive unit 67 includes an unillustrated motor for rotating gas supply pipe that rotates the gas supply pipe 61, and an unillustrated motor for lifting gas supply pipe as a gas supply pipe lifting unit that lifts the gas supply pipe 61 up/down. These motors can rotate the gas supply pipe 61 in a predetermined direction and lift it up/down. A chamber attachment part at the top of the upper gas supply pipe 61b is sealed by a sealing member 58.

Preferably, at least the section of the gas supply pipe 61 that enters inside the thermal insulation cylinder 19 should comprise a heat-resistant material. In this embodiment, the lower gas supply pipe 61a should preferably comprise a highly heat-resistant material such as carbon, quartz, or molybdenum.

The gas supply pipe 61 of the deformation prevention gas blowout unit 60 can operate in synchronism with the upward/downward lifting of the quartz crucible 13

The top end of the upper gas supply pipe 61b connects to an unillustrated tank for storing inert gas G. The gas supply pipe 61 is fitted with an unillustrated flow adjustment valve for adjusting the flow of inert gas G along the supply pipe.

As a cooling mechanism, cold water or cooling gas is supplied through an unillustrated cooling pipe that is wound around the upper gas supply pipe 61b.

An unillustrated rotary encoder is fitted to an unillustrated output axis of the motor for pulling of the pulling unit 22, and the crucible-driving unit 17 is fitted with an unillustrated weight sensor, that detects the weight of the silicon melt 12 in the quartz crucible 13, and a linear encoder that detects the lift position of the support axis 16. The detect outputs of rotary encoder, the weight sensor, and the linear encoder connect to control inputs of an unillustrated controller, and control outputs of the controller connect respectively to the motor for pulling of the pulling unit 22, the motor for lifting crucible of the crucible-driving unit 17, and the motor for lifting gas supply pipe of the drive unit 67 of the gas blow unit.

Subsequently, a method for pulling silicon single crystal using the apparatus for pulling single crystal 10a of this embodiment will be explained.

As shown in FIG. 7, a high-purity polycrystalline silicon body is placed in the quartz crucible 13, and the heater 18 heats and melts the high-purity polycrystalline silicon body to form the silicon melt 12. After the polycrystalline silicon body melts and the silicon melt 12 accumulates in the quartz crucible 13, inert gas is supplied into the casing 21 by opening the first and second flow adjustment valves 31 and 32, and gas that evaporates from the surface of the silicon melt 12 is discharged via the discharge pipe 30 together with the inert gas.

The motor for pulling, provided in the pulling unit 22, is then used to reel out the wire cable 23 and lower the seed crystal 24 until the tip of the seed crystal 24 touches the silicon melt 12. The seed crystal 24 is pulled gradually so that a seed aperture part 25a is formed, and then pulled further to grow a shoulder part 25b below the seed aperture part 25a.

After the shoulder part 25b is grown, the seed crystal 24 is pulled further to form a trunk part 25c below the shoulder part 25b.

Figure 8:
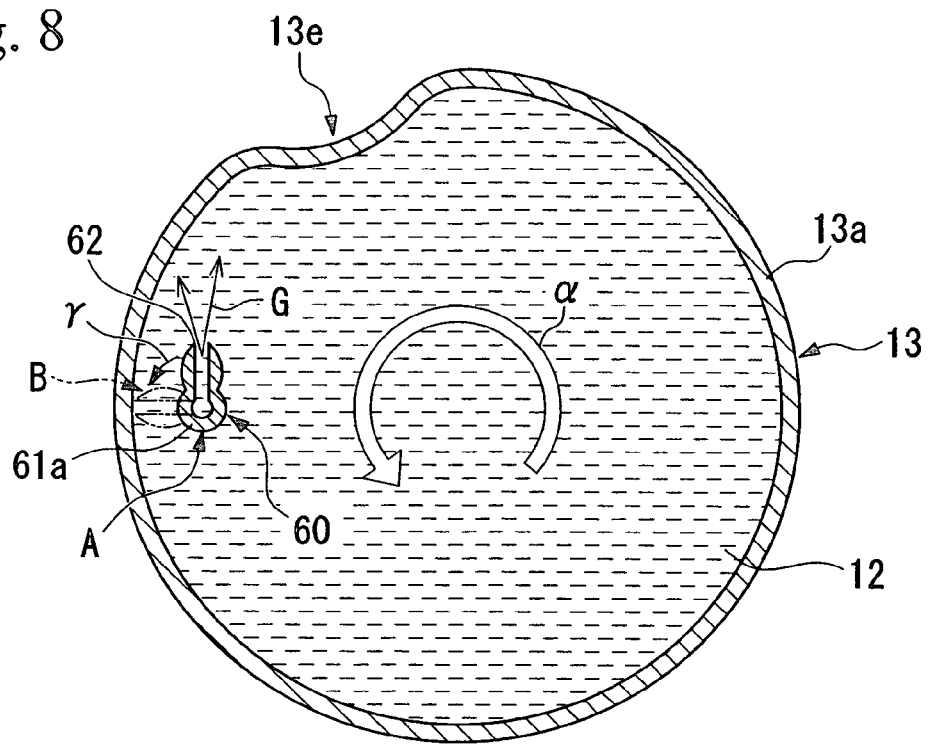
FIG. 8 is a diagram illustrating a method for repairing deformation of a crucible by using the apparatus for pulling single crystal of FIG. 7, being a horizontal cross-sectional view of a quartz crucible and a gas blowout unit for preventing deformation.
Figure 10:
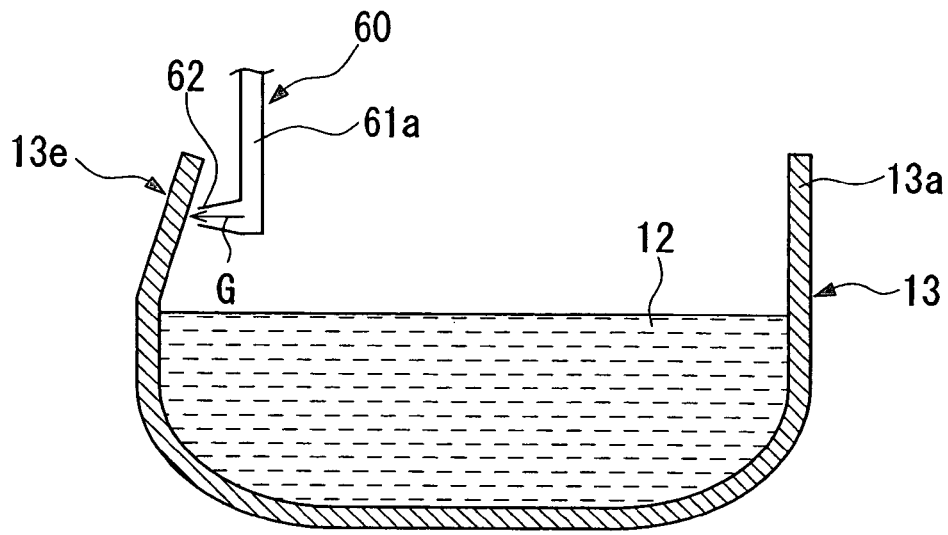
FIG. 10 is a diagram illustrating a method for repairing deformation of a crucible by using the apparatus for pulling single crystal of FIG. 7, being a vertical cross-sectional view of a quartz crucible and a gas blowout unit for preventing deformation.

When a deformed part 13e such as that shown in FIGS. 8 and 10 appears in the wall part 13a of the quartz crucible 13 due to softening while forming the trunk part 25c, the gas supply pipe 61 of the deformation prevention gas blowout unit 60 is lifted up and down by the motor for lifting gas supply pipe so that there is a gap between the gas blow outlet 62 provided to the tip of the gas supply unit 61 and the inner side of the wall part of the quartz crucible 13 (the position indicated by solid line A in FIG. 8) and the outlet reaches a predetermined position above the surface of the silicon melt 12 stored in the quartz crucible as shown in FIG. 10 (beside the deformation in the wall part 13a of the quartz crucible 13 caused by softening while pulling the single crystal).

Figure 9:
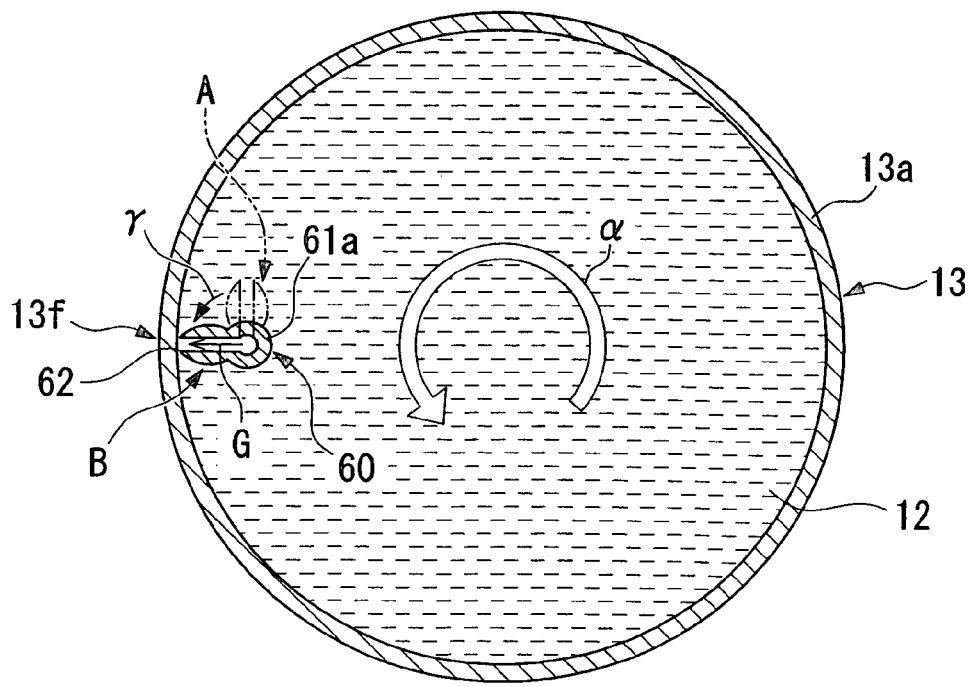
FIG. 9 is a diagram illustrating a method for repairing deformation of a crucible and a method for preventing deformation by using the apparatus for pulling single crystal of FIG. 7, being a horizontal cross-sectional view of a quartz crucible and a gas blowout unit for preventing deformation.

When the tip of the gas supply pipe 61 is arranged beside the deformed part 13e, the motor for rotating gas supply pipe rotates the gas supply pipe 61 in a counterclockwise direction γ so that the gas blow outlet 62 at the tip of the gas supply pipe 61 is made to face and touch the inner side of the wall part of the quartz crucible 13 (the position indicated by dotted line B in FIG. 8), that is being rotated in a counterclockwise direction α by the first motor for rotating. The gas flow adjustment valve is opened so that the cooled inert gas G blows against the inner face of the wall part, thereby scanning the inner side of the wall part and pressing the wall part from the inside, making it possible to repair deformation caused by collapse and the like of the wall part 13a of the quartz crucible 13 while pulling the single crystal, as shown in FIG. 9. At the time of repairing deformation of the wall part 13a, the cooled inert gas G is blown by supplying cold water or cooling gas along the cooling pipe wound around the upper gas supply pipe 61b.

When there is a danger of deformation in the wall part 13a of the quartz crucible 13 due to softening while forming the trunk part 25c, the motor for lifting gas supply pipe is used to lift the gas supply pipe 61 of the deformation prevention gas blowout unit 60 up/down so that there is a gap between the tip of the gas supply pipe 61 and inner side of the wall part of the quartz crucible 13 (the position indicated by dotted line A in FIG. 9) and the tip reaches a predetermined position above the surface of the silicon melt 12 stored in the quartz crucible (beside a location 13f where there is a danger of deformation in the wall part 13a of the quartz crucible 13 due to softening while pulling the single crystal).

When the tip of the gas supply pipe 61 is positioned beside the location 13f where there is a danger of deformation, the motor for rotating gas supply pipe rotates the gas supply pipe 61 in the counterclockwise direction γ so that the gas blow outlet 62 at the tip of the gas supply pipe 61 is made to face and touch the inner side of the wall part of the quartz crucible 13 (the position indicated by solid line B in FIG. 9), that is being rotated in the counterclockwise direction a by the first motor for rotating. The gas flow adjustment valve is opened so that the cooled inert gas G blows against the inner face of the wall part, scanning the inner side of the wall part and pressing the wall part from the inside, thereby making it possible to prevent deformation caused by collapse and the like of the wall part 13a of the quartz crucible 13 during the process of pulling the single crystal.

The operation of using the deformation prevention gas blowout unit 60 to prevent deformation of the wall part of the quartz crucible 13 may be performed before heating the quartz crucible 13 or before it softens.

Thus, when the tip of the gas supply pipe 61 is arranged, before the softening of the quartz crucible 13, beside the location 13f where there is a danger of deformation, the motor for rotating gas supply pipe rotates the gas supply pipe 61 in the counterclockwise direction γ, opening the gas flow adjustment valve so that the cooled inert gas G blows against the inner face of the wall part, scanning the inner side of the wall part and cooling the wall part 13a to prevent it from softening, whereby it becomes possible to prevent deformation caused by collapse and the like of the wall part 13a of the quartz crucible 13 during the process of pulling the single crystal.

Incidentally, while this embodiment includes a rotatable gas supply pipe 61 fitted to the deformation prevention gas blowout unit 60, it is acceptable for the gas supply pipe 61 to move horizontally instead.

Figure 11:
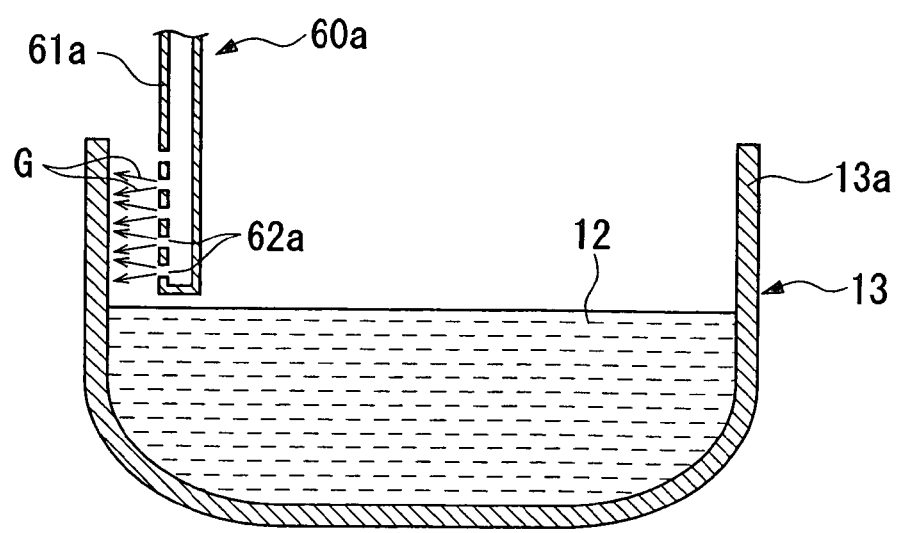
FIG. 11 is a cross-sectional view of another embodiment of a gas blowout unit for preventing deformation equipped to the apparatus for pulling single crystal.
Figure 12:
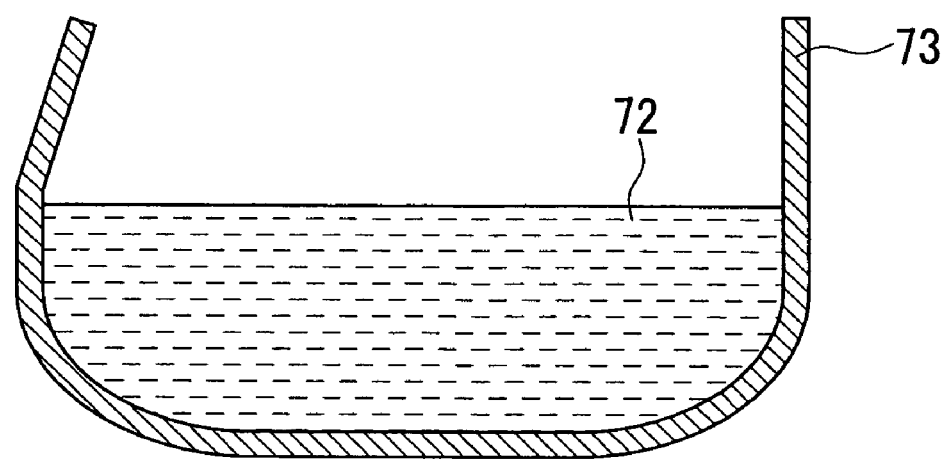
FIG. 12 is a schematic diagram of the collapsed state of a wall part of a quartz crucible fitted to a conventional apparatus for pulling single crystal.

A deformation prevention gas blowout unit 60a such as that shown in FIG. 11 may be used as the deformation prevention gas blowout unit that is fitted to the apparatus for pulling silicon single crystal according to this embodiment. The deformation prevention gas blowout unit 60a differs from the deformation prevention gas blowout unit 60 shown in FIG. 7 in that a great many gas blow outlets 62a are provided parallel to the up-down direction of the gas supply pipe 61 in the side face of the tip of the gas supply pipe 61. According to the apparatus for pulling single crystal equipped with the deformation prevention gas blowout unit 60a of this configuration, pressure of gas blown from the gas supply pipe 61 can be increased, increasing the possible cooling range of the wall part 13a and enhancing the effects of repairing and preventing deformation in the wall part 13a caused by softening during the process of pulling the single crystal.

While preferred embodiments of the invention have been described above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An apparatus for pulling a single crystal comprising:
   a quartz crucible provided in a chamber for storing a raw melt of a single crystal;
   a heater that heats the raw melt of said crystal;
   a crucible driving unit that rotates said quartz crucible;
   an arm having a pressing face; and
   an arm driving unit that lifts said arm up and down, and moves said pressing face so that said pressing face presses against a wall part of said quartz crucible.

2. An apparatus for pulling a single crystal according to claim 1, wherein said arm comprises:
   a support rod configured to be lifted up and down;
   a protrusion that is provided on the support rod and protrudes in one direction away from the support rod; and
   said pressing face provided on said protrusion,
   wherein operation of said support rod moves said pressing face so that said pressing face presses against said wall part of said quartz crucible from the inside.

3. An apparatus for pulling a single crystal according to any of claim 1, wherein said crucible driving unit lifts said quartz crucible up and down, and said arm driving unit is controlled so as to lift said arm up and down in synchronization with the lifting of the quartz crucible.

4. An apparatus for pulling a single crystal according to claim 1, wherein said arm driving unit rotates said arm or moves said arm horizontally.

5. An apparatus for pulling a single crystal comprising:
a quartz crucible provided in a chamber for storing a raw melt of a single crystal;
a heater that heats the raw melt of said single crystal;
a crucible driving unit that rotates said quartz crucible;
a gas blowout unit having a gas outlet;
a gas supply unit that blows inert gas through said gas outlet; and
a gas blowout driving unit that lifts said gas blowout unit up and down, and moves said gas outlet so as to face a wall part of said quartz crucible.

6. An apparatus for pulling a single crystal according to claim 5, wherein said gas blowout unit comprises:
a gas supply pipe configured to be lifted up and down; and
a gas blow outlet that is provided at the bottom end of the gas supply pipe, wherein
said gas blow outlet is arranged so as to blow inert gas to an inside face of the wall part of the quartz crucible by operating the gas supply pipe, and
a gas pressure of the inert gas blown from said gas blow outlet is capable of pressing the inside the inside face of the wall part of the quartz crucible.

7. An apparatus for pulling a single crystal according to claim 6, wherein a cooling mechanism is provided around said gas supply pipe.

8. An apparatus for pulling a single crystal according to claim 5, wherein said gas supply unit blows inert gas through said gas outlet to said wall part of said quartz crucible so as to lower, the temperature of said wall part.

9. An apparatus for pulling a single crystal according to claim 5, wherein a cooling mechanism is provided around said gas blowout unit.

10. An apparatus for pulling a single crystal of claim 5, wherein said crucible driving unit lifts said quartz crucible up and down, and said gas blowout driving unit is controlled so as to lift said gas blowout unit up and down in synchronization with the lifting of said quartz crucible.

11. An apparatus for pulling a single crystal of claim 5, wherein said gas supply unit blows inert gas through said gas outlet to said wall part of said quartz crucible so as to press said wall part.

12. An apparatus for pulling a single crystal of claim 5, wherein said gas blowout driving unit rotates said gas blowout unit or moves said gas blowout unit horizontally.

* * * * *